United States Patent
Zou et al.

(10) Patent No.: US 10,354,901 B2
(45) Date of Patent: Jul. 16, 2019

(54) CONVEYING DEVICE, CONVEYING METHOD AND EVAPORATION APPARATUS

(71) Applicant: BOE TECHNOLOGY GROUP CO., LTD., Beijing (CN)

(72) Inventors: Qinghua Zou, Beijing (CN); Shupeng Guo, Beijing (CN); Changqi Hu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 79 days.

(21) Appl. No.: 15/540,545

(22) PCT Filed: Sep. 14, 2016

(86) PCT No.: PCT/CN2016/098977
§ 371 (c)(1),
(2) Date: Jun. 28, 2017

(87) PCT Pub. No.: WO2017/118084
PCT Pub. Date: Jul. 13, 2017

(65) Prior Publication Data
US 2018/0005858 A1    Jan. 4, 2018

(30) Foreign Application Priority Data
Jan. 6, 2016 (CN) .......................... 2016 1 0007169

(51) Int. Cl.
*H01L 21/677* (2006.01)
*H01L 21/67* (2006.01)
(Continued)

(52) U.S. Cl.
CPC .... *H01L 21/67742* (2013.01); *H01L 21/6719* (2013.01); *H01L 21/6776* (2013.01);
(Continued)

(58) Field of Classification Search
CPC ........... B25B 11/00; B23Q 1/03; B23Q 1/154; B23Q 1/186; H01L 21/67742;
(Continued)

(56) References Cited

U.S. PATENT DOCUMENTS 4,473,455 A * 9/1984 Dean ....................... C23C 14/50
                                                      118/50.1
4,971,676 A * 11/1990 Doue ....................... C23C 14/50
                                                      118/503
(Continued)

FOREIGN PATENT DOCUMENTS

CN   102108502 A   6/2011
CN   102117588 A   7/2011
(Continued)

OTHER PUBLICATIONS

"Second office action," CN Application No. 201610007169.9 (dated May 21, 2018).
(Continued)

*Primary Examiner* — George B Nguyen
(74) *Attorney, Agent, or Firm* — Womble Bond Dickinson (US) LLP

(57) ABSTRACT

A conveying device, a conveying method, and an evaporation apparatus are provided. The conveying device comprises a carrying mechanism for carrying a substrate; and a fastening mechanism for fastening the substrate on the carrying mechanism in a mechanical manner. In the conveying device, the substrate is fastened on the carrying mechanism in a mechanical manner by the fastening mechanism. As compared with electrostatic fastening and adhesive fastening, this reduces damage to the substrate, increases the reliability for fastening the substrate, and makes it easy to receive and detach the substrate.

18 Claims, 4 Drawing Sheets

(51) Int. Cl.
*H01L 21/687* (2006.01)
*H01L 21/673* (2006.01)

(52) U.S. Cl.
CPC .. *H01L 21/67346* (2013.01); *H01L 21/67745* (2013.01); *H01L 21/68707* (2013.01); *H01L 21/68721* (2013.01); *H01L 21/68742* (2013.01)

(58) Field of Classification Search
CPC .......... H01L 21/6719; H01L 21/67346; H01L 21/67745; C09K 13/00
USPC ........... 29/281.5, 281.1, 281.6; 269/266, 903
See application file for complete search history.

(56) References Cited

U.S. PATENT DOCUMENTS

| | | | | |
|---|---|---|---|---|
| 5,152,707 A | * | 10/1992 | Dougherty | B23Q 1/032 269/21 |
| 5,226,056 A | * | 7/1993 | Kikuchi | G03F 7/427 156/345.34 |
| 5,673,167 A | * | 9/1997 | Davenport | C23C 14/541 269/903 |
| 6,162,336 A | * | 12/2000 | Lee | C23C 14/50 118/500 |
| 2004/0097088 A1 | * | 5/2004 | Kitayama | C30B 31/14 438/694 |
| 2011/0159702 A1 | * | 6/2011 | Ohizumi | C23C 16/45551 438/778 |
| 2015/0128749 A1 | * | 5/2015 | Gilchrist | H01L 21/67742 74/490.04 |
| 2015/0203965 A1 | * | 7/2015 | Enomoto | C23C 16/4584 438/758 |

FOREIGN PATENT DOCUMENTS

| | | |
|---|---|---|
| CN | 104795344 A | 7/2015 |
| CN | 105575866 A | 5/2016 |
| JP | 2011137795 A | 7/2011 |

OTHER PUBLICATIONS

Office Action in Chinese Application No. 201610007169.9 dated Sep. 19, 2017, with English translation.
International Search Report and Written Opinion in PCT/CN2016/098977 dated Dec. 19, 2016, with English translation.

* cited by examiner

CONVEYING DEVICE, CONVEYING METHOD AND EVAPORATION APPARATUS

RELATED APPLICATIONS

The present application is the U.S. national phase entry of PCT/CN2016/098977, with an international filing date of Sep. 14, 2016, which claims the benefit of Chinese Patent Application 201610007169.9, filed on Jan. 6, 2016, the entire disclosures of which are incorporated herein by reference.

TECHNICAL FIELD

The present disclosure relates to the display field, and particularly to a conveying device, a conveying method, and an evaporation apparatus.

BACKGROUND

Currently, evaporation has been popular in the process for fabricating an organic light emitting diode (OLED). An evaporation apparatus generally has an inline type construction or a cluster type construction. A cluster type evaporation apparatus generally adopts a manipulator arm for conveying a glass substrate into respective chamber. After the substrate is aligned with a mask plate, the evaporation starts. In the inline type, the substrate is fastened on a conveying device. After alignment with the mask plate, the substrate is moved at a constant speed over heating sources in which different materials are filled, so that an OLED device is formed on the substrate.

As compared with the cluster type, the inline type evaporation apparatus has advantages of saving space and reducing tact time. However in the inline type design, it is a great challenge to carry and convey the substrate, align the substrate with the mask plate, and move to an evaporation chamber. Due to the weight and bending of the substrate with a large size, the substrate is generally conveyed in an upright posture. This requires that a linear heating source is also in the upright posture, which increases the difficulty in controlling the linear heating source to maintain thickness uniformity of the organic material in the evaporation process. Besides, in the upright conveying process, a film evaporating surface of the substrate is directed obliquely upwards, particles are prone to deposit on the film evaporating surface of the substrate, and this increases the defect rate due to particles and reduces yield.

To avoid the above problems, in the inline type design, a TFT face (i.e., the film evaporating surface) of the substrate is also directed downward during conveying in a large scale evaporation apparatus. To overcome factors like the weight and bending of the substrate with a large size, the substrate is generally fastened on the conveying device by electrostatic fastening or adhesive fastening. However, electrostatic fastening tends to cause damage to the TFT on the substrate. As for adhesive fastening, it is difficult to control the adhesion strength of the adhesive. Low adhesion strength leads to the substrate falling off, while high adhesion strength leads to difficulty in subsequent detaching. In addition, the adhesive will change its adhesion properties, or will age when it is heated during evaporation.

SUMMARY

It is an object of embodiments of the present disclosure to solve one or more the above mentioned technical problems or other technical problems.

An embodiment of the present disclosure provides a conveying device, comprising:
a carrying mechanism, which is configured to carry a substrate; and
a fastening mechanism, which is configured to fasten the substrate on the carrying mechanism in a mechanical manner.

In the present embodiment, the conveying device reduces damage to the conveyed substrate, and makes it easy to receive and detach the substrate.

In an embodiment of the present disclosure, the conveying device further comprises a lifting mechanism, which is provided with through holes and runs through the through holes to lift the substrate.

In an embodiment of the present disclosure, the through holes are uniformly arranged in the carrying mechanism.

In an embodiment of the present disclosure, the lifting mechanism comprises lifting pins, and each of the lifting pins corresponds to each of the through holes in a one-to-one manner.

In an embodiment of the present disclosure, the conveying device further comprises an actuator which is configured to drive the lifting mechanism.

In an embodiment of the present disclosure, the fastening mechanism comprises slidable components, which are arranged at a periphery of the carrying mechanism and are configured to fasten the substrate.

In an embodiment of the present disclosure, the fastening mechanism comprises two groups of slidable components, and each group comprises two slidable components which are arranged oppositely.

In an embodiment of the present disclosure, the slidable components are made from a metallic material.

In an embodiment of the present disclosure, each of the slidable components is provided with a groove structure, and the substrate is fastened by embedding an edge portion of the substrate in the groove structure.

In an embodiment of the present disclosure, an elastic lubricating layer is arranged in the groove structure.

In an embodiment of the present disclosure, each of the slidable components is detachably installed on the carrying mechanism.

In an embodiment of the present disclosure, each of the slidable components has a cross section with the shape of a letter "L" or a Chinese character "凹" in a direction perpendicular to an extending direction of the slidable components.

In an embodiment of the present disclosure, the carrying mechanism is provided with protrusions at positions where the substrate is carried, the protrusions are arranged outside a region where the through holes are arranged, and the protrusions are configured to suspend the edge portion of the substrate when the substrate is placed on the carrying mechanism.

In an embodiment of the present disclosure, a lower surface of the groove structure is flush with an upper surface of the protrusions.

In an embodiment of the present disclosure, a lower surface of the groove structure is flush with a lower surface of the slidable components, an upper surface of the groove structure is higher than an upper surface of the protrusions, and a difference in height between the upper surface of the groove structure and the upper surface of the protrusions is larger than or equal to a thickness of the substrate.

An embodiment of the present disclosure further provides an evaporation apparatus, which comprise the above mentioned conveying device.

An embodiment of the present disclosure further provides a conveying method, which comprises:

placing a substrate on a carrying mechanism; and fastening the substrate on the carrying mechanism in a mechanical manner by a fastening mechanism.

In an embodiment of the present disclosure, placing the substrate on the carrying mechanism comprises:

driving a lifting mechanism to pass through through holes of the carrying mechanism, and to rise to a preset position;

placing the substrate on the lifting mechanism; and driving the lifting mechanism to descend, so that the substrate is descended and placed on the carrying mechanism.

In an embodiment of the present disclosure, after fastening the substrate on the carrying mechanism in the mechanical manner by the fastening mechanism, the method further comprises:

driving the carrying mechanism to flip, so that a film evaporating surface of the substrate is directed downwards; and after evaporation on the film evaporating surface, driving the carrying mechanism so that the film evaporating surface of the substrate is directed upwards, releasing the substrate from being fastened by the fastening mechanism, and driving the lifting mechanism to rise so as to detach the substrate from the carrying mechanism.

In the conveying device of the present disclosure, the substrate is fastened on the carrying mechanism in a mechanical manner by the fastening mechanism. As compared with electrostatic fastening and adhesive fastening, this reduces damage to the substrate, increases the reliability for fastening the substrate, and makes it easy to receive and detach the substrate.

DETAILED DESCRIPTION OF EMBODIMENTS

Specific embodiments of the present disclosure will be further described hereinafter with reference to the drawings and embodiments. The following embodiments are only used for explaining more clearly the technical solution of the present disclosure rather than limiting the protection scope of the present disclosure.

An embodiment of the present disclosure provides a conveying device. The conveying device comprises: a carrying mechanism, which is configured to carry a substrate; and a fastening mechanism, which is configured to fasten the substrate on the carrying mechanism in a mechanical manner.

In the conveying device of the present embodiment, the substrate is fastened on the carrying mechanism in a mechanical manner by the fastening mechanism. As compared with electrostatic fastening and adhesive fastening, this reduces damage to the substrate, increases the reliability for fastening the substrate, and makes it easy to receive and detach the substrate.

In an embodiment of the present disclosure, the fastening mechanism fastens the substrate in a mechanical manner. For example, the fastening mechanism is a mechanical fastening structure, like a buckle and an elastic clamp. The substrate is tightly compressed on the carrying mechanism by the fastening mechanism, so that the substrate is fastened.

In an embodiment of the present disclosure, in order to make it easy to receive and detach the substrate, the conveying device further comprises a lifting mechanism, and the carrying mechanism is provided with through holes. The lifting mechanism runs through the through holes to lift the substrate, which makes it easy to place the substrate on the carrying mechanism and to detach the substrate from the carrying mechanism.

In an embodiment of the present disclosure, the fastening mechanism fastens the substrate on the carrying mechanism in a mechanical fastening manner. For example, slidable components are arranged at a periphery of the carrying mechanism. Each of the slidable components is provided with a groove structure. By embedding an edge portion of the substrate in the groove structure, it is possible to fasten the substrate on the carrying mechanism.

Figure 1:
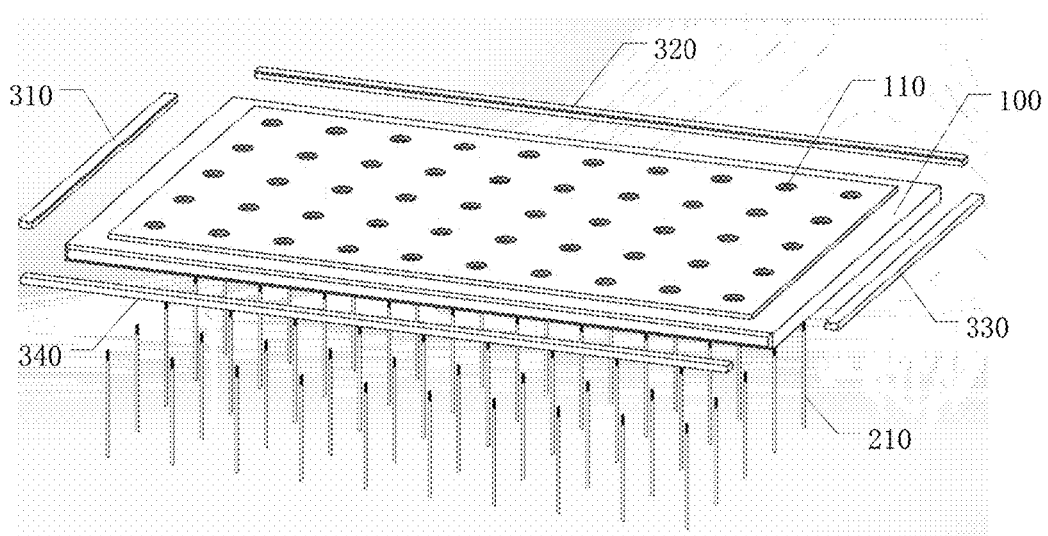
FIG. 1 is a schematic view for illustrating a conveying device in an embodiment of the present disclosure.

Referring to FIG. 1, which shows a conveying device in an embodiment of the present disclosure, the conveying device comprises a carrying mechanism, a lifting mechanism, and a fastening mechanism.

A carrying mechanism 100 is configured to carry the substrate, and a plurality of through holes 110 are uniformly arranged in the carrying mechanism 100.

The lifting mechanism comprises lifting pins 210, and each lifting pin corresponds to each of the through holes 110 in a one-to-one manner. The lifting pins 210 run through the through holes 110 to control the lifting of substrate. As a result, the lifting pins 210 are capable of placing the substrate on the carrying mechanism or detaching the substrate from the carrying mechanism.

The fastening mechanism is configured to fasten the substrate on the carrying mechanism 100. The fastening mechanism comprises two groups of slidable components. Each group of slidable components comprises two slidable components which are arranged oppositely. One of the groups comprises a slidable component 310 and a slidable component 330, and the other group comprises a slidable component 320 and a slidable component 340. With these two groups of slidable components, each edge of the substrate of a rectangular shape can be fastened so that all sides of the substrate are fastened by slidable components. A groove structure is arranged in each of the slidable components, so that it is possible to fasten the substrate on the carrying mechanism by embedding the edge portion of the substrate in the groove structure. During the subsequent flipping action to direct a film evaporating surface of the substrate downwards, it is possible to prevent the substrate from falling off or the misalignment between the substrate and the mask plate, due to the weight and bending of the substrate with a large size.

Figure 2:
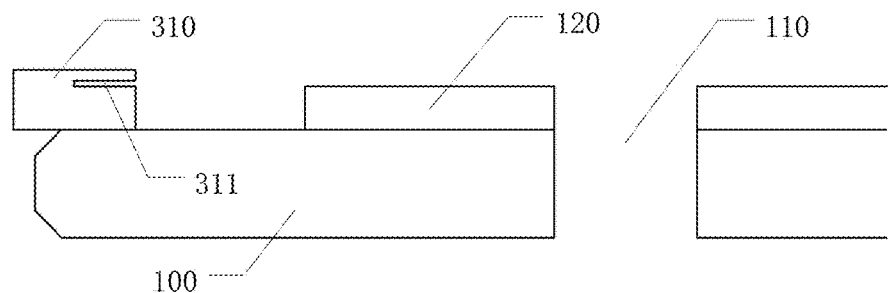
FIG. 2 is a schematic view for illustrating a slidable component in an embodiment of the present disclosure.
Figure 2:
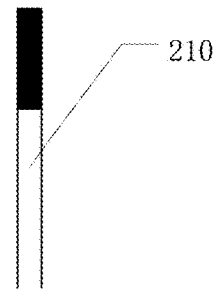
Figure 3:
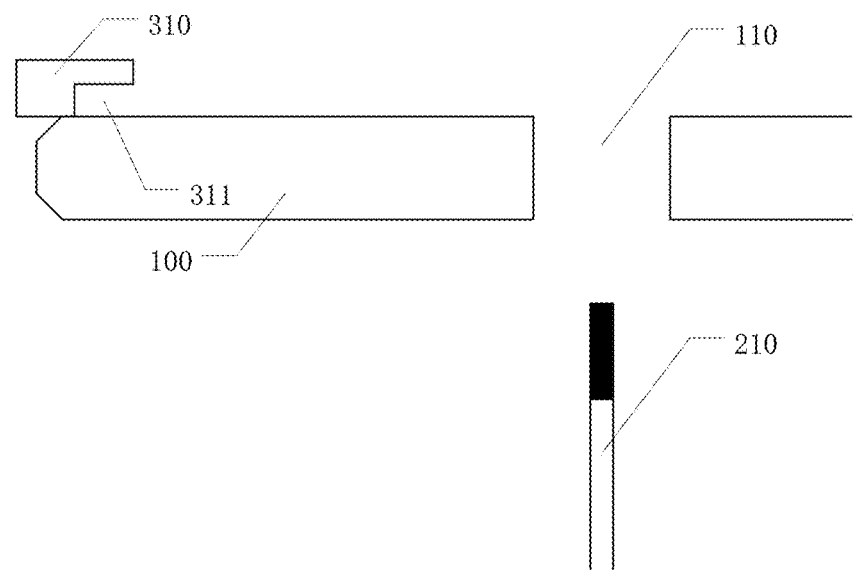
FIG. 3 is a schematic view for illustrating another slidable component in an embodiment of the present disclosure.

In a direction perpendicular to an extending direction of the slidable components, each of the slidable components has a cross section with the shape of a Chinese character "凹", as shown in FIG. 2. Alternatively, the cross section has a shape of a letter "L", as shown in FIG. 3. Namely, a lower surface of a groove structure 311 is flush with a lower surface of each slidable component. By embedding the edge portion of the substrate in the groove structure 311 of each slidable component, it is possible to fasten the substrate on the carrying mechanism 100.

For example, as for the slidable component 310 shown in FIG. 2, at positions of the carrying mechanism where the substrate is carried, protrusions 120 are provided. The protrusions 120 are arranged outside a region where the through holes 110 are arranged. In other words, opening portions are arranged among the protrusions 120 and correspond to the through holes 100 in a one-to-one manner. In an exemplary embodiment, the opening portions have a same shape and size as the through holes 110. Embodiments of the present disclosure do not intend to limit the size and shape of opening portions, as long as the opening portions do not hinder the lifting pins 210 of the lifting mechanism from running through. The protrusions 120 have an area smaller than an area of the substrate to be carried, and the lower surface of the groove structure 311 in each slidable component and the upper surface of the protrusions 120 are arranged in a same horizontal plane. In case the substrate is placed on the carrying mechanism 100, due to the presence of the protrusions 120, the edge portion of the substrate is suspended. In this way, the edge portion of the substrate is easily embedded in the groove structure of each slidable component. For example, the substrate is a display substrate. In case the substrate placed on the carrying mechanism, a display region of the substrate is arranged at the positions of protrusions, while a peripheral region outside the display region is suspended at the edge of protrusions.

In an embodiment of the present disclosure, the slidable components are made from a metallic material. For example, the slidable components are made from a metal with a high strength, so that in case the groove structure is deformed slightly, the fastening and alignment of the substrate would not be affected.

In an embodiment of the present disclosure, an elastic lubricating layer is arranged in the groove structure of each slidable component. For example, an organic coating is formed in the groove structure. This organic coating prevents friction between the substrate and the groove structure, which otherwise would introduce microcracks in the substrate and break the substrate into pieces.

In an embodiment of the present disclosure, each of the slidable components is detachably installed on the carrying mechanism, so as to be capable of conveying substrates of different thicknesses.

According to the conveying device of the present disclosure, the fastening mechanism adopts a mechanical manner for fastening the substrate. In practical production, a same action is performed on each substrate for a same duration, and this eliminates the substrate-to-substrate difference among different manners for fastening substrate. Suction and separation time which is essential in the adhesive fastening is saved in the conveying device of the present disclosure, and this saves the tact time.

In an embodiment of the present disclosure, the conveying device further comprises an actuator which is configured to drive the lifting mechanism. The lifting mechanism is driven by the actuator to lift, so that it can receive and detach the substrate.

An embodiment of the present disclosure further provides an evaporation apparatus, which comprises the conveying device in the above embodiments. For example, the evaporation apparatus is of the inline type.

Besides, the present disclosure further provides a conveying method by using the conveying device as described above. This method comprises:

S1: placing a substrate on a carrying mechanism; and

S2: fastening the substrate on the carrying mechanism in a mechanical manner by a fastening mechanism.

For example, as for the conveying device shown in FIG. 1, placing the substrate on the carrying mechanism comprises:

S11: driving the lifting mechanism to run through through holes of the carrying mechanism, and to rise to a preset position;

S12: placing the substrate on the lifting mechanism; and

S13: driving the lifting mechanism to descend, so that the substrate is descended and placed on the carrying mechanism.

In embodiments of the present disclosure, the conveying method for example is applied to an evaporation process. After the substrate is fastened on the carrying mechanism in a mechanical manner by the fastening mechanism, the method further comprises:

S14: driving the carrying mechanism to flip, so that a film evaporating surface of the substrate is directed downwards; and S15: after evaporation on the film evaporating surface, driving the carrying mechanism so that the film evaporating surface of the substrate is directed upwards, releasing the substrate from being fastened by the fastening mechanism, and driving the lifting mechanism to rise so as to detach the substrate from the carrying mechanism.

For example, the conveying method for example is applied to an evaporation process of an array substrate. The method comprises the following steps.

Figure 4:
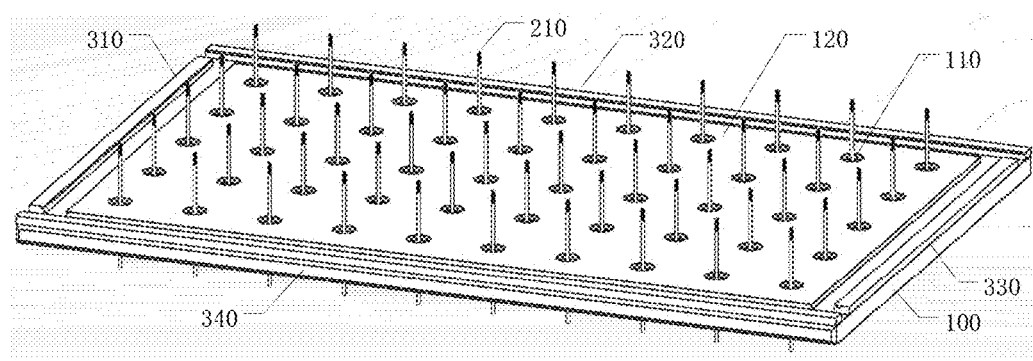
FIGS. 4, 5, 6, 7, 8, 9 are schematic views for illustrating a conveying device which conveys a substrate in an embodiment of the present disclosure.

S21: as shown in FIG. 4, firstly the lifting pins 210 are driven to run through the through holes 110 of the carrying mechanism 100, and to rise from an initial position to a preset position.

Figure 5:
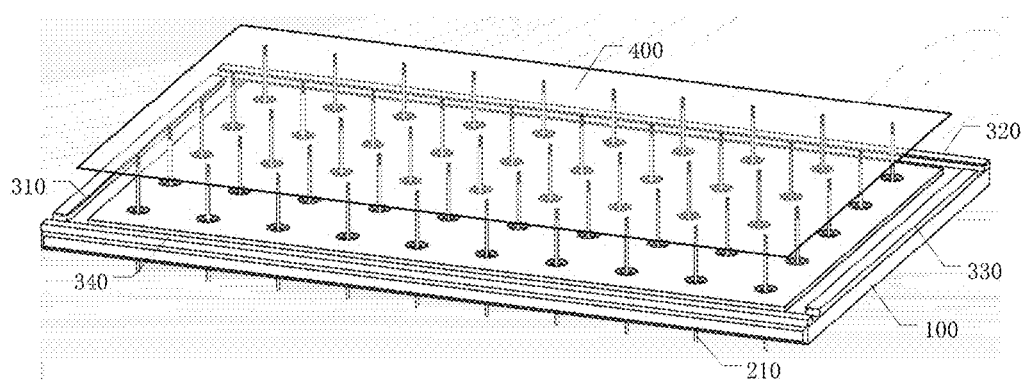

S22: a substrate 400 is placed on the top end of the lifting pins 210 by a manipulator arm, and the manipulator arm is withdrawn. As shown in FIG. 5, the substrate 400 is placed on the lifting pins 210.

Figure 6:
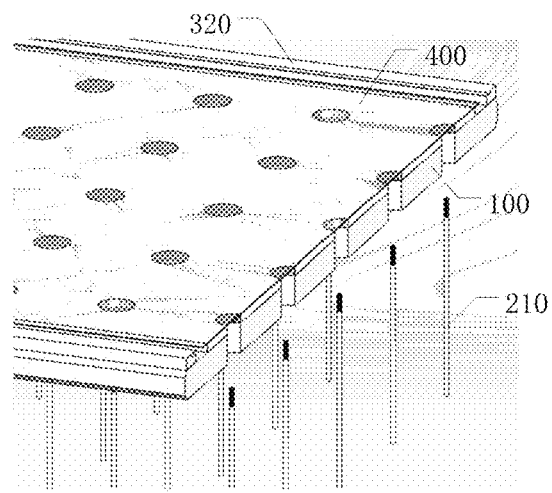
Figure 7:
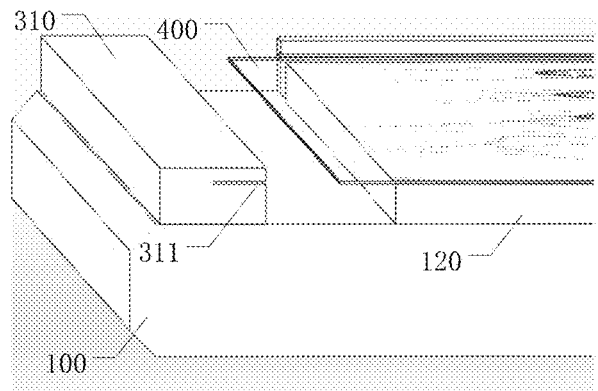

S23: the lifting pins 210 descends to the initial position, so that the substrate 400 is arranged on the surface of the carrying mechanism 100, as shown in FIG. 6 and FIG. 7.

Figure 8:
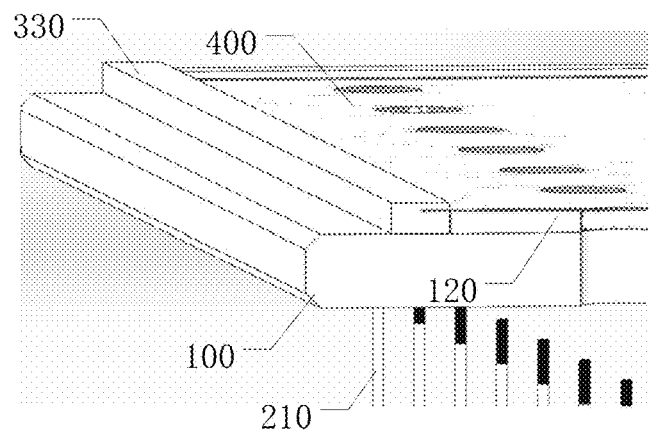
Figure 9:
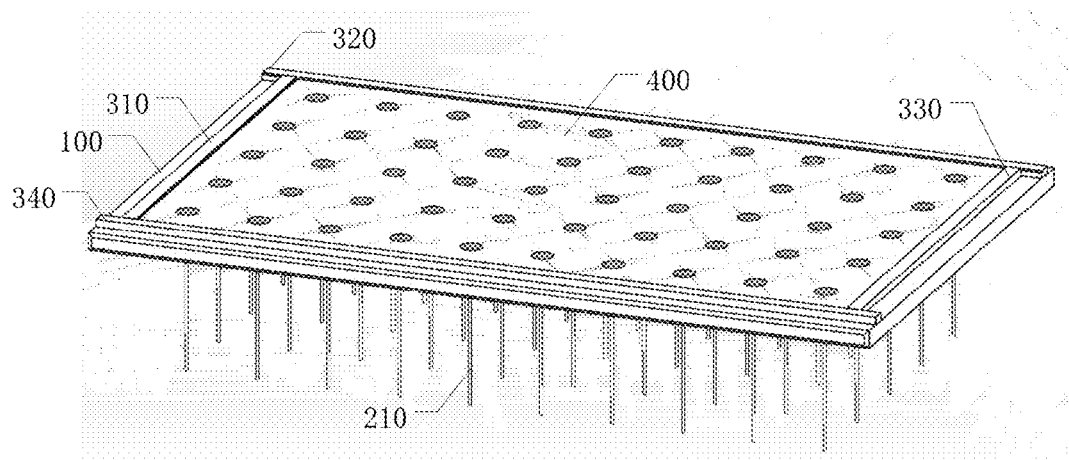
Figure 10:
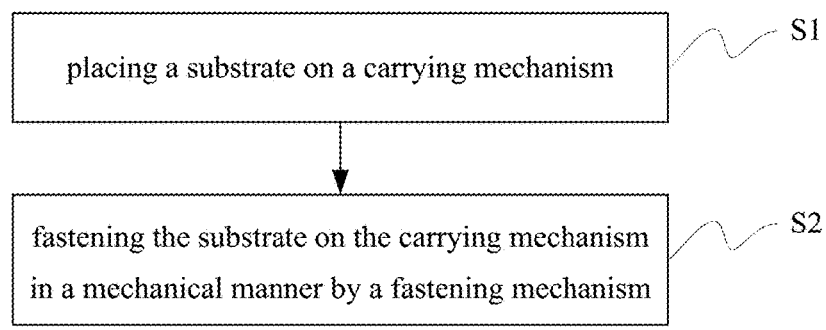
FIG. 10 is a flow chart for illustrating a conveying method in an embodiment of the present disclosure.

S24: each slidable component in the fastening mechanism is driven to slide from an unlocked position to a locked position. As shown in FIG. 8 and FIG. 9, the substrate 400 is fastened on the carrying mechanism.

S25: after the substrate 400 is fastened, the substrate and the carrying mechanism are transferred together by a motor, and are ready for the subsequent processes like flipping and evaporation.

S26: after the evaporation process, the carrying mechanism is driven so that the film evaporating surface of the substrate is directed upwards. The slidable components of the fastening mechanism are slided from the locked position to the unlocked position, so that the substrate is released from being fastened by the fastening mechanism. Then, the lifting mechanism is driven to rise to the preset position, so that the substrate is detached from the carrying mechanism. Again, the substrate on which evaporation has been performed is transferred by the manipulator arm.

In the embodiment shown in FIGS. 7, 8 and 9, each slidable component has a cross section with the shape of a Chinese character "凹", and is slidable in a plane parallel with the substrate, in a direction perpendicular to a side of the substrate. This is also applicable to slidable components with a shape of a letter "L".

It is noted that the technical features in the above embodiments can be combined, as long as there is no conflict between these technical features. As an example, the protrusions 120 shown in FIG. 2 are combined with the slidable component 310 shown in FIG. 3. For example, the upper surface of the groove structure 311 in the slidable component 310 is higher than the upper surface of the protrusions 120, and a difference in height between the upper surface of the groove structure and the upper surface of the protrusions is larger than or equal to the thickness of the substrate to be carried, so that the groove structure 311 accommodates the edge portion of the substrate and thus fastens the substrate on the carrying mechanism 100. In case the substrate is placed on the carrying mechanism 100, the substrate is carried in the display region by the protrusions 120, the peripheral region outside the display region is suspended at the edge of the protrusions 120, and the substrate is limited in in the peripheral region by the upper surface of the groove structure 311. Namely, the substrate being carried on the carrying mechanism 100 is held between the upper surface of the groove structure 311 and the upper surface of the protrusions 120.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A conveying device, comprising:
   a carrying mechanism, which is configured to carry a substrate; and
   a fastening mechanism, which is configured to fasten the substrate on the carrying mechanism in a mechanical manner,
   wherein the fastening mechanism comprises slidable components, which are arranged at a periphery of the carrying mechanism and are configured to fasten the substrate.

2. The conveying device of claim 1, wherein the fastening mechanism comprises two groups of slidable components, and each group comprises two slidable components which are arranged oppositely.

3. The conveying device of claim 1, wherein the slidable components are made from a metallic material.

4. The conveying device of claim 1, wherein each of the slidable components is provided with a groove structure, and the substrate is fastened by embedding an edge portion of the substrate in the groove structure.

5. The conveying device of claim 4, wherein an elastic lubricating layer is arranged in the groove structure.

6. The conveying device of claim 1, wherein each of the slidable components is detachably installed on the carrying mechanism.

7. The conveying device of claim 4, wherein each of the slidable components has a cross section with the shape of a letter "L" or a Chinese character "凹" in a direction perpendicular to an extending direction of the slidable components.

8. The conveying device of claim 4, wherein the carrying mechanism is provided with protrusions at positions where the substrate is carried, the protrusions are arranged outside a region where the through holes are arranged, and the protrusions are configured to suspend the edge portion of the substrate when the substrate is placed on the carrying mechanism.

9. The conveying device of claim 8 wherein a lower surface of the groove structure is flush with an upper surface of the protrusions.

10. The conveying device of claim 8 wherein a lower surface of the groove structure is flush with a lower surface of the slidable components, an upper surface of the groove structure is higher than an upper surface of the protrusions, and a difference in height between the upper surface of the groove structure and the upper surface of the protrusions is larger than or equal to a thickness of the substrate.

11. An evaporation apparatus, comprising the conveying device of claim 1.

12. A conveying method, comprising:
    placing a substrate on a carrying mechanism; and
    fastening the substrate on the carrying mechanism in a mechanical manner by a fastening mechanism,
    wherein the fastening mechanism comprises slidable components, which are arranged at a periphery of the carrying mechanism and are configured to fasten the substrate.

13. The conveying method of claim 12, wherein placing the substrate on the carrying mechanism comprises:
    driving a lifting mechanism to pass through through holes of the carrying mechanism, and to rise to a preset position;
    placing the substrate on the lifting mechanism; and
    driving the lifting mechanism to descend, so that the substrate is descended and placed on the carrying mechanism.

14. The conveying method of claim 13, wherein after fastening the substrate on the carrying mechanism in the mechanical manner by the fastening mechanism, the method further comprises:
    driving the carrying mechanism to flip, so that a film evaporating surface of the substrate is directed downwards; and
    after evaporation on the film evaporating surface, driving the carrying mechanism so that the film evaporating surface of the substrate is directed upwards, releasing the substrate from being fastened by the fastening mechanism, and driving the lifting mechanism to rise so as to detach the substrate from the carrying mechanism.

15. The conveying device of claim 1, further comprising a lifting mechanism, which is provided with through holes and runs through the through holes to lift the substrate.

16. The conveying device of claim 15, wherein the through holes are uniformly arranged in the carrying mechanism.

17. The conveying device of claim 16, wherein the lifting mechanism comprises lifting pins, and each of the lifting pins corresponds to each of the through holes in a one-to-one manner.

18. The conveying device of claim 15, further comprising an actuator which is configured to drive the lifting mechanism.

* * * * *